(12) United States Patent
Kariya

(10) Patent No.: US 10,734,405 B2
(45) Date of Patent: Aug. 4, 2020

(54) SEMICONDUCTOR MEMORY DEVICE

(71) Applicant: TOSHIBA MEMORY CORPORATION, Minato-ku (JP)

(72) Inventor: Nayuta Kariya, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 106 days.

(21) Appl. No.: 16/124,489

(22) Filed: Sep. 7, 2018

(65) Prior Publication Data

US 2019/0157295 A1    May 23, 2019

(30) Foreign Application Priority Data

Nov. 20, 2017   (JP) .................................. 2017-222941

(51) Int. Cl.
*H01L 27/11582*   (2017.01)
*H01L 29/06*   (2006.01)
*H01L 27/1157*   (2017.01)

(52) U.S. Cl.
CPC .... *H01L 27/11582* (2013.01); *H01L 27/1157* (2013.01); *H01L 29/0649* (2013.01)

(58) Field of Classification Search
CPC ........... H01L 27/11582; H01L 27/1157; H01L 29/0649
See application file for complete search history.

(56) References Cited

U.S. PATENT DOCUMENTS

| 7,868,376 | B2 | 1/2011 | Aoyama et al. |
| 9,082,714 | B2 | 7/2015 | Koval et al. |
| 2016/0064532 | A1* | 3/2016 | Makala ............. H01L 27/11524 257/316 |
| 2016/0336330 | A1* | 11/2016 | Masuoka .............. H01L 23/535 |

FOREIGN PATENT DOCUMENTS

| JP | 2009-212218 | 9/2009 |
| JP | 2014-022394 | 2/2014 |
| JP | 2014-530501 | 11/2014 |

* cited by examiner

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

According to one embodiment, a semiconductor memory device includes a substrate, a plurality of electrode films arranged along a first direction with an air gap interposed, the first direction crossing a surface of the substrate, a semiconductor member extending in the first direction, a charge storage member provided between the semiconductor member and each of the electrode films, and a high dielectric constant film provided along an outer surface of the air gap, a relative dielectric constant of the high dielectric constant film being higher than a relative dielectric constant of silicon oxide.

20 Claims, 7 Drawing Sheets

FIG. 1

SEMICONDUCTOR MEMORY DEVICE

CROSS-REFERENCE TO RELATED APPLICATION

This application is based upon and claims the benefit of priority from Japanese Patent Application No. 2017-222941, filed on Nov. 20, 2017; the entire contents of which are incorporated herein by reference.

FIELD

Embodiments described herein relate generally to a semiconductor memory device.

BACKGROUND

In recent years, a stacked semiconductor memory device has been proposed in which memory cells are integrated three-dimensionally. In such a stacked semiconductor memory device, a stacked body in which electrode films and insulating films are stacked alternately is provided on a semiconductor substrate; and semiconductor pillars that pierce the stacked body are provided. Memory cell transistors are formed at each crossing portion between the electrode films and the semiconductor pillars. In such a stacked semiconductor memory device, it is desired to shorten the spacing between the electrode films as much as possible to realize even higher integration.

DETAILED DESCRIPTION

According to one embodiment, a semiconductor memory device includes a substrate, a plurality of electrode films arranged along a first direction with an air gap interposed, the first direction crossing a surface of the substrate, a semiconductor member extending in the first direction, a charge storage member provided between the semiconductor member and each of the electrode films, and a high dielectric constant film provided along an outer surface of the air gap, a relative dielectric constant of the high dielectric constant film being higher than a relative dielectric constant of silicon oxide.

Embodiments of the invention will now be described with reference to the drawings.

First Embodiment

A first embodiment will now be described.

Figure 1:
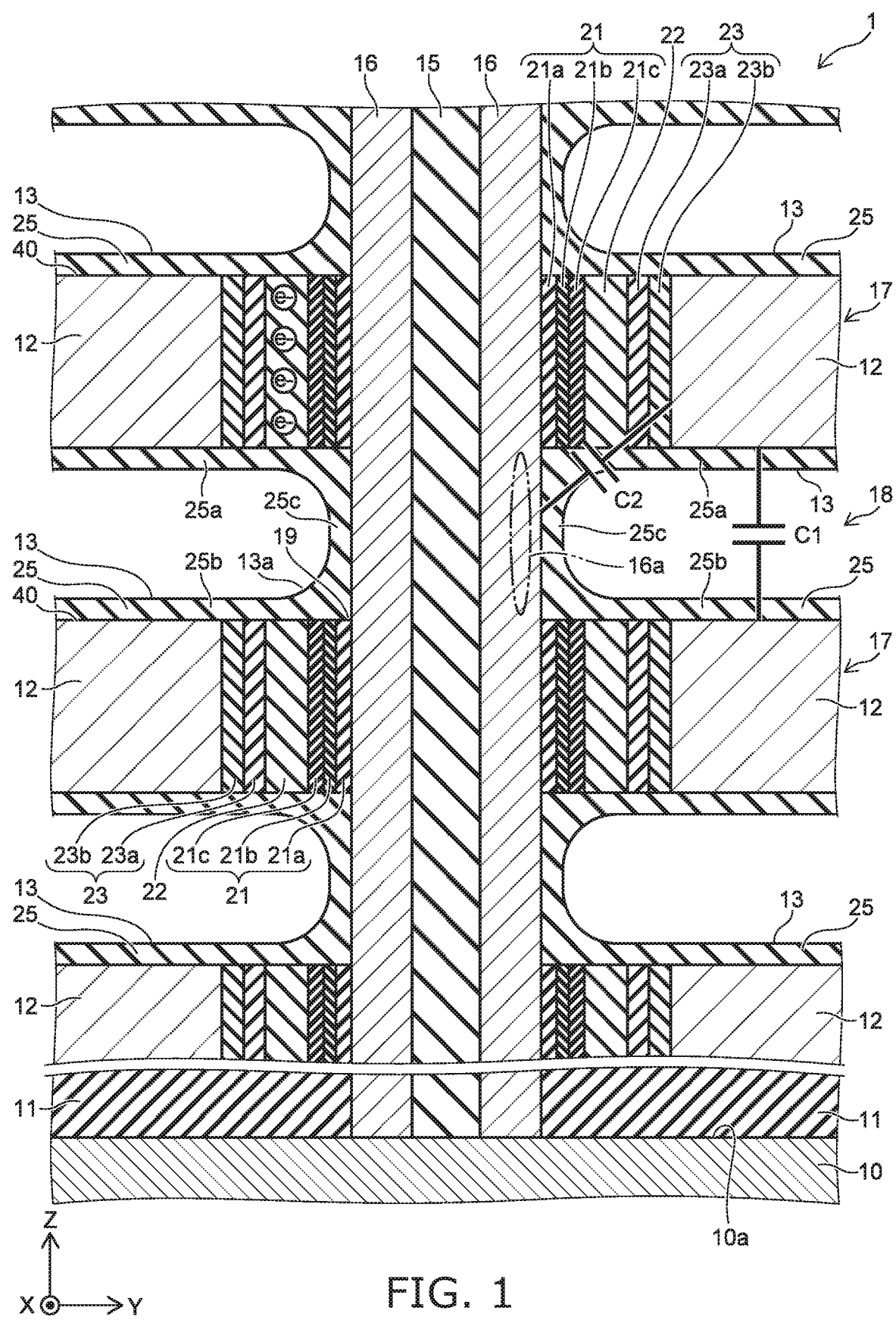
FIG. 1 is a cross-sectional view showing a semiconductor memory device according to a first embodiment.

FIG. 1 is a cross-sectional view showing a semiconductor memory device according to the embodiment.

Figure 2A:
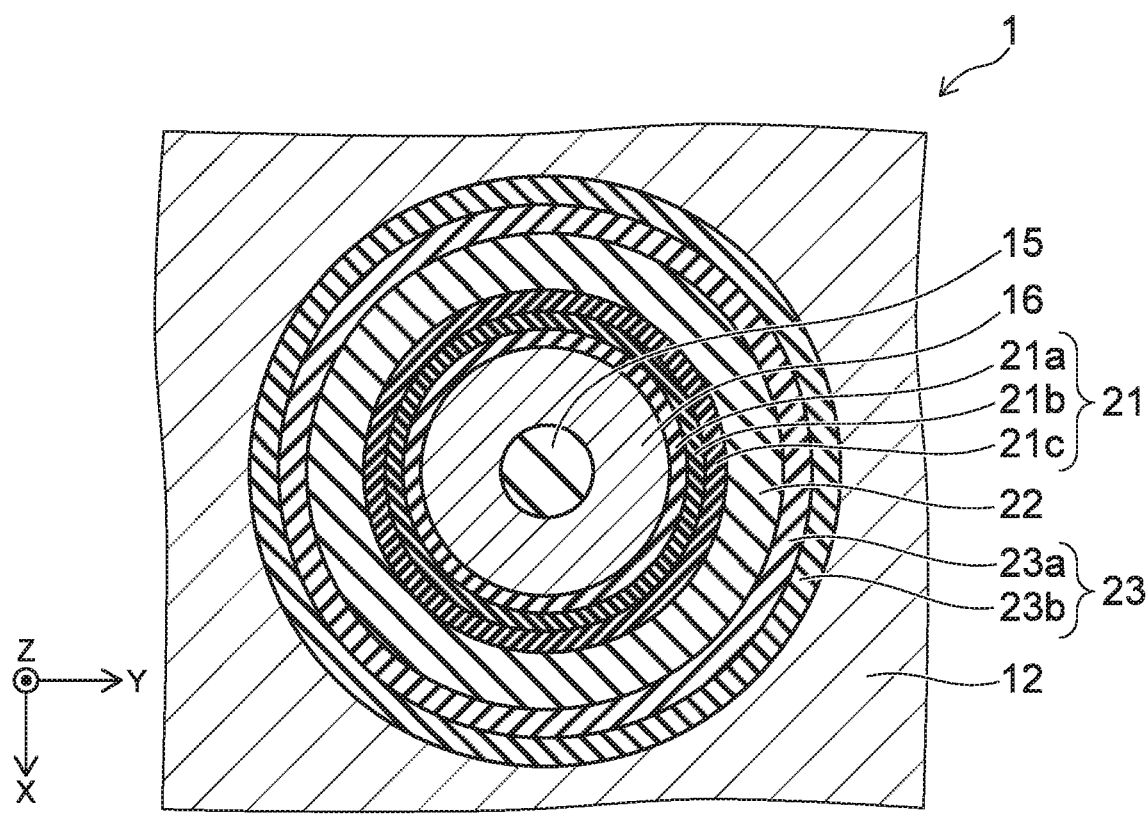
FIGS. 2A and 2B are cross-sectional views showing the semiconductor memory device according to the first embodiment.
Figure 2B:
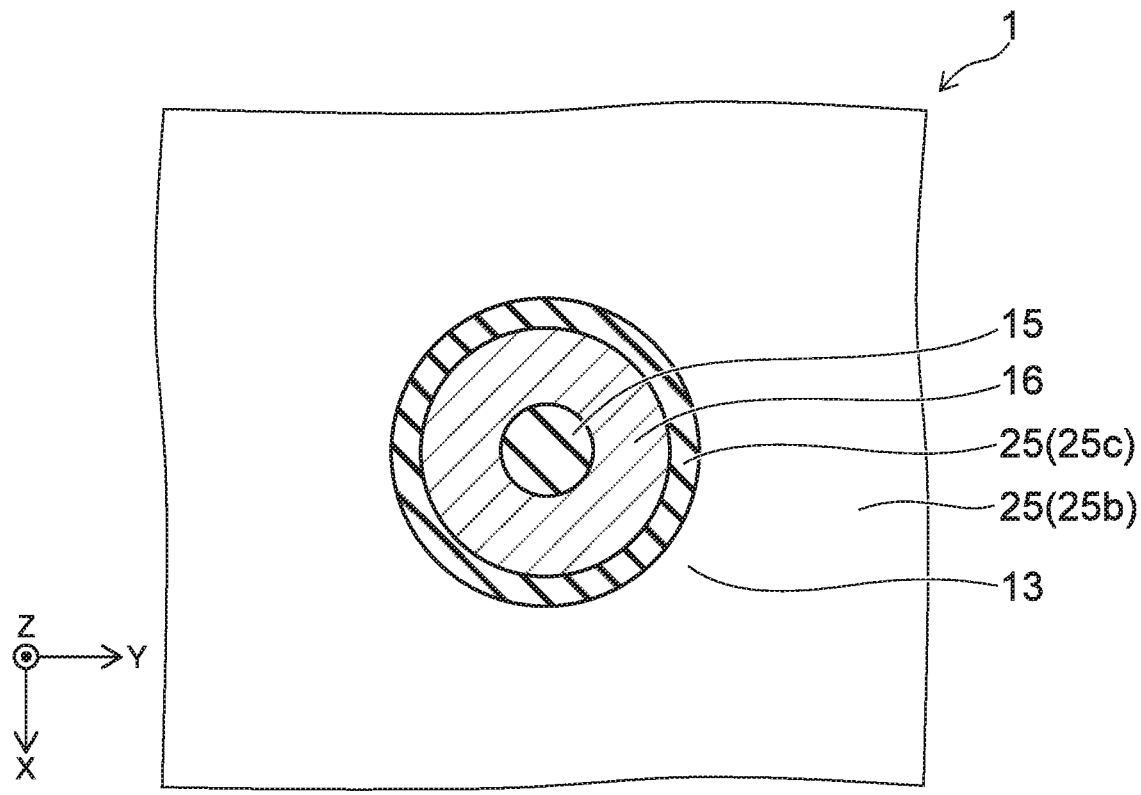

FIGS. 2A and 2B are cross-sectional views showing the semiconductor memory device according to the embodiment; FIG. 2A shows a cross section including an electrode film; and FIG. 2B shows a cross section including an air gap.

The semiconductor memory device according to the embodiment is stacked NAND flash memory.

As shown in FIG. 1 and FIGS. 2A and 2B, a substrate 10 is provided in the semiconductor memory device 1 according to the embodiment. The substrate 10 may be a semiconductive or conductive silicon substrate or may include a conductive film provided on a silicon substrate. In the case where the substrate 10 includes a conductive film provided on a silicon substrate, an inter-layer insulating film may be provided between the silicon substrate and the conductive film; and a circuit (not illustrated) that includes transistors, interconnects, etc., may be formed inside the upper layer portion of the silicon substrate and inside the inter-layer insulating film. A silicon oxide film 11 is provided on the substrate 10.

In the specification hereinbelow, an XYZ orthogonal coordinate system is employed for convenience of description. Two mutually-orthogonal directions parallel to an upper surface 10a of the substrate 10 are taken as an "X-direction" and a "Y-direction;" and a direction perpendicular to the upper surface 10a of the substrate 10 is taken as a "Z-direction." Although a direction that is in the Z-direction from the substrate 10 toward the silicon oxide film 11 also is called "up" and the reverse direction also is called "down," these expressions are for convenience and are independent of the direction of gravity.

In the specification, "silicon oxide film" refers to a film having silicon oxide (SiO) as a major component and includes silicon (Si) and oxygen (O). This is similar for the other components as well; and in the case where the material name is included in the name of the component, the material is a major component of the component. Because silicon oxide generally is an insulating material, a silicon oxide film is an insulating film unless otherwise indicated. This is similar for the other members as well; and as a general rule, the characteristics of the member reflect the characteristics of the major component.

Multiple electrode films 12 are arranged on the silicon oxide film 11 to be separated from each other along the Z-direction, i.e., a direction crossing the surface of the substrate 10. The electrode films 12 are formed of a conductive material, e.g., a metal material such as tungsten (W) or the like, polysilicon including an impurity, etc. The configurations of the electrode films 12 are band configurations extending in the X-direction. Among the multiple electrode films 12, one or more electrode films 12 from the top function as a drain-side select gate electrode; one or more electrode films 12 from the bottom function as a source-side select gate electrode; and at least a portion of the electrode films 12 disposed between the drain-side select gate electrode and the source-side select gate electrode functions as control electrodes of the memory cells. An air gap 13 is formed between the electrode films 12 adjacent to each other in the Z-direction.

A core member 15 that extends in the Z-direction is provided on the substrate 10. The core member 15 is formed of, for example, an insulating material such as silicon oxide, etc. The configuration of the core member 15 is a column, e.g., a circular column having the Z-direction as an axis direction. The core member 15 pierces the multiple electrode films 12 arranged along the Z-direction.

A silicon pillar 16 is provided as a semiconductor member on the side surface of the core member 15. The configuration of the silicon pillar 16 is a tubular configuration, e.g., a circular tube having the Z-direction as an axis direction. The lower end of the silicon pillar 16 is connected to the substrate 10. The upper end (not illustrated) of the silicon pillar 16 is connected to an upper layer interconnect (not illustrated).

A tunneling insulating film 21, a charge storage film 22, and a blocking insulating film 23 are provided between the silicon pillar 16 and at least the electrode films 12 functioning as control electrodes. The tunneling insulating film 21, the charge storage film 22, and the blocking insulating film 23 are stacked in this order from the silicon pillar 16 toward the electrode films 12. The configurations of the tunneling insulating film 21, the charge storage film 22, and the blocking insulating film 23 are circular ring configurations surrounding the silicon pillar 16. The electrode films 12 each surround the core member 15, the silicon pillar 16, the tunneling insulating film 21, the charge storage film 22, and the blocking insulating film 23. A cell gate layer 17 includes one electrode film 12 functioning as a control electrode, and includes the tunneling insulating film 21, the charge storage film 22, and the blocking insulating film 23 provided between the electrode film 12 and the silicon pillar 16.

Although the tunneling insulating film 21 normally is insulative, the tunneling insulating film 21 is a film in which a tunneling current flows when a prescribed voltage within the range of the drive voltage of the semiconductor memory device 1 is applied. In the tunneling insulating film 21, a silicon oxide layer 21a, a silicon nitride layer 21b, and a silicon oxide layer 21c are stacked in this order from the silicon pillar 16 toward the electrode film 12. The silicon oxide layer 21a contacts the silicon pillar 16; the silicon oxide layer 21c contacts the charge storage film 22; and the silicon nitride layer 21b is disposed between the silicon oxide layer 21a and the silicon oxide layer 21c. The tunneling insulating film 21 may be a single-layer silicon oxide film or a two-layer film in which a silicon oxide layer and a silicon oxynitride layer (SiON) are stacked.

The charge storage film 22 is a charge storage member that can store charge, is made from, for example, a material having trap sites of electrons, and is made of, for example, silicon nitride (SiN).

The blocking insulating film 23 is a film in which a current substantially does not flow even when a voltage within the range of the drive voltage of the semiconductor memory device 1 is applied. In the blocking insulating film 23, a silicon oxide layer 23a and a high dielectric constant layer 23b are stacked in this order from the silicon pillar 16 toward the electrode film 12. The silicon oxide layer 23a contacts the charge storage film 22; and the high dielectric constant layer 23b contacts the electrode film 12. The high dielectric constant layer 23b is made from a high dielectric constant material having a higher relative dielectric constant than silicon oxide and is made of, for example, aluminum oxide (AlO), zirconium oxide (ZrO), or silicon nitride.

A high dielectric constant film 25 is provided on the surface of a structure body 18 including the silicon pillar 16 and the two cell gate layers 17 adjacent to each other in the Z-direction. The high dielectric constant film 25 is formed to be continuous along the surface of the structure body 18. In other words, the high dielectric constant film 25 is disposed on the side surface of the silicon pillar 16, on the upper surface of the tunneling insulating film 21, on the lower surface of the tunneling insulating film 21, on the upper surface of the charge storage film 22, on the lower surface of the charge storage film 22, on the upper surface of the blocking insulating film 23, on the lower surface of the blocking insulating film 23, on the upper surface of the electrode film 12, and on the lower surface of the electrode film 12. The high dielectric constant film 25 is made from a high dielectric constant material having a higher relative dielectric constant than silicon oxide and is made of, for example, aluminum oxide or hafnium oxide (HfO).

A portion of the high dielectric constant film 25 along the lower surface of the cell gate layer 17 on the upper side of the structure body 18 is taken as a first portion 25a; a portion of the high dielectric constant film 25 along the upper surface of the cell gate layer 17 on the lower side of the structure body 18 is taken as a second portion 25b; a portion of the high dielectric constant film 25 along the side surface of the silicon pillar 16 is taken as a third portion 25c; and the air gap 13 is disposed between the first portion 25a and the second portion 25b. Also, the air gap 13 is disposed at the side of the third portion 25c. In other words, the high dielectric constant film 25 is provided along the outer surface of the air gap 13. The thickness of the third portion 25c may be thicker than, thinner than, or the same thickness as those of the first portion 25a and the second portion 25b.

As shown in FIG. 1, the high dielectric constant film 25 is provided to be thicker on corner portions 19 of the structure body 18 where the side surface of the silicon pillar 16 crosses the extension planes of the upper surface and the lower surface of the electrode films 12 than at the other portions. Therefore, in the cross section along the Z-direction shown in FIG. 1, the curvatures of an air gap-exposed surface 13a at the surface portions of the high dielectric constant film 25 where the high dielectric constant film 25 is exposed in the air gap 13 at positions between the first portion 25a and the third portion 25c and between the second portion 25b and the third portion 25c are smaller than the curvatures of the corner portions 19. In other words, the air gap-exposed surface 13a of the high dielectric constant film 25 provided on the corner portions 19 is rounded more gradually than the corner portions 19 which are the foundation.

The tunneling insulating film 21, the charge storage film 22, and the blocking insulating film 23 are not disposed between the silicon pillar 16 and the high dielectric constant film 25. In other words, the tunneling insulating film 21, the charge storage film 22, and the blocking insulating film 23 are divided along the Z-direction by the air gap 13; and the divided portions each are disposed between the silicon pillar 16 and the electrode film 12. The high dielectric constant film 25 contacts the silicon pillar 16.

In the semiconductor memory device 1, a memory cell transistor that has the silicon pillar 16 as a channel, the electrode film 12 as a gate, the tunneling insulating film 21 and the blocking insulating film 23 as a gate insulating film, and the charge storage film 22 as a charge storage member are formed at each crossing portion between the silicon pillar 16 and the electrode film 12.

There are cases where the upper end portion and the lower end portion of the silicon pillar 16 include impurities that form donors or acceptors; and p-n junctions are formed. On the other hand, the portion of the silicon pillar 16 where the memory cell transistors are configured, i.e., the central portion of the silicon pillar 16 opposing the multiple electrode films 12 and the multiple air gaps 13, substantially does not include an impurity or includes a uniform concentration of an impurity that forms donors or acceptors. Therefore, a p-n junction is not formed in the central portion of the silicon pillar 16.

A method for manufacturing the semiconductor memory device 1 according to the embodiment will now be described.

First, the silicon oxide film 11 is formed on the substrate 10; and a stacked body is formed by alternately stacking the electrode films 12 and sacrificial films (not illustrated) on the silicon oxide film 11. It is sufficient for the sacrificial films to be films that can have etching selectivity with the electrode films 12; and the sacrificial films may be, for example, silicon oxide films, silicon nitride films, or metal films.

Continuing, a memory hole that extends in the Z-direction and reaches the substrate 10 is formed in the stacked body. Then, the high dielectric constant layer 23b, the silicon oxide layer 23a, the charge storage film 22, the silicon oxide layer 21c, the silicon nitride layer 21b, and the silicon oxide layer 21a are formed in this order on the inner surface of the memory hole. Then, these layers and films that are on the bottom surface of the memory hole are removed; and the substrate 10 is exposed. Then, the silicon pillar 16 is formed by depositing silicon on the side surface of the silicon oxide layer 21a. Then, the core member 15 is formed by filling the interior of the memory hole with silicon oxide.

Continuing, a slit (not illustrated) is formed in the stacked body; and the sacrificial films are removed via the slit. Thereby, spaces 40 are formed where the sacrificial films are removed. Then, the blocking insulating film 23, the charge storage film 22, and the tunneling insulating film 21 other than the portions positioned between the silicon pillar 16 and the electrode films 12 are removed via the spaces 40. Then, the high dielectric constant film 25 is formed on the inner surfaces of the spaces 40 via the slit. At this time, the surface of the high dielectric constant film 25 can be rounded according to the formation conditions of the high dielectric constant film 25. Then, for example, the interior of the slit is refilled with an insulating material. At this time, the spaces 40 are not refilled. As a result, the portions inside the spaces 40 not filled with the high dielectric constant film 25 become the air gaps 13. In other words, the high dielectric constant film 25 is formed along the outer surface of the air gap 13. Thus, the semiconductor memory device 1 according to the embodiment is manufactured.

Operations of the semiconductor memory device 1 according to the embodiment will now be described.

Electrons are injected from the silicon pillar 16 into the charge storage film 22 via the tunneling insulating film 21 by applying a potential to the electrode film 12 that is higher than that of the silicon pillar 16. Thereby, the threshold of the memory cell transistor increases. Also, by applying a potential to the silicon pillar 16 that is higher than that of the electrode film 12, the electrons that are stored inside the charge storage film 22 are discharged via the tunneling insulating film 21; or the electrons that are stored inside the charge storage film 22 are annihilated by injecting holes from the silicon pillar 16 into the charge storage film 22 via the tunneling insulating film 21. Thereby, the threshold of the memory cell transistor decreases. Thus, data is stored by changing the threshold of the memory cell transistor. Then, the stored data is read by evaluating the threshold of the memory cell transistor.

Effects of the embodiment will now be described.

In the embodiment, a parasitic capacitance C1 between the electrode films 12 is small because the air gap 13 is formed between the electrode films 12. Therefore, the delay of the signals is low when the electrode films 12 are used as interconnects. As a result, the spacing of the electrode films 12 in the Z-direction can be set to be short; and the integration of the semiconductor memory device 1 can be increased.

In the embodiment, the charge storage film 22 is divided every memory cell transistor by the air gap 13. Therefore, the movement of the electrons stored in the charge storage film 22 of one memory cell transistor into the charge storage film 22 of an adjacent memory cell transistor by diffusing through the charge storage film 22 can be suppressed. As a result, the data retention of the semiconductor memory device 1 is good. Thereby, the spacing of the charge storage films 22 in the Z-direction can be set to be short; and the integration of the semiconductor memory device 1 can be increased.

In the embodiment, the tunneling insulating film 21 is divided every memory cell by the air gap 13. Therefore, the air gap 13 is interposed between the charge storage film 22 of one memory cell transistor and the silicon pillar 16 of an adjacent memory cell transistor. As a result, the effect on the threshold of the adjacent memory cell transistor due to the electric field caused by the electrons stored in the charge storage film 22 of the one memory cell transistor can be suppressed. Thus, the interference between the memory cell transistors can be suppressed. Thereby, the integration of the semiconductor memory device 1 can be increased.

In the embodiment, the high dielectric constant film 25 is provided along the outer surface of the air gap 13. Therefore, the volume of the air gap 13 interposed between one electrode film 12 and a portion (hereinbelow, called an "inter-cell portion 16a") of the silicon pillar 16 surrounded with the air gap 13 adjacent to the one electrode film 12 is small. Further, the high dielectric constant film 25 that is on the corner portions 19 of the structure body 18 is provided to be particularly thick; and the air gap-exposed surface 13a is gradually rounded. Thus, as shown in FIG. 1, a capacitance C2 between the one electrode film 12 and the inter-cell portion 16a adjacent to the one electrode film 12 is larger than that of the case where the high dielectric constant film 25 is not provided. Thereby, the fringe electric field of the electrode film 12 on the inter-cell portion 16a is strong; and even in the case where a p-n junction is not formed in the portion of the silicon pillar 16 surrounded with the air gap 13, an inversion layer is formed reliably in the inter-cell portion 16a; and conduction can be caused. As a result, the resistance of the silicon pillar 16 can be reduced.

Second Embodiment

A second embodiment will now be described.

Figure 3:
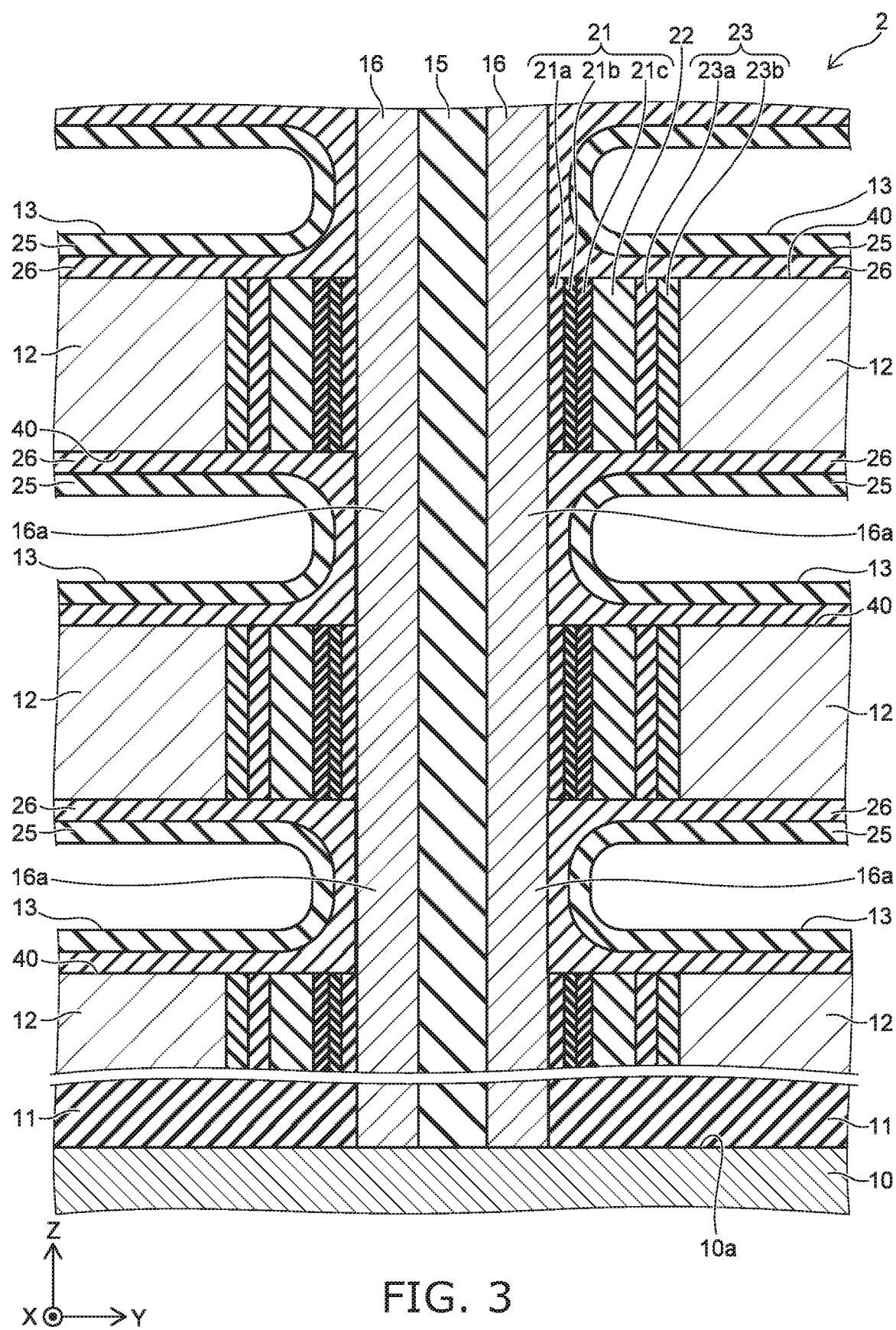
FIG. 3 is a cross-sectional view showing a semiconductor memory device according to a second embodiment.

FIG. 3 is a cross-sectional view showing a semiconductor memory device according to the embodiment.

In the semiconductor memory device 2 according to the embodiment as shown in FIG. 3, a buffer film 26 is provided in addition to the configuration of the semiconductor memory device 1 according to the first embodiment described above (referring to FIG. 1 and FIGS. 2A and 2B). The buffer film 26 is insulative. The energy barrier of the buffer film 26 is higher than the energy barrier of the high dielectric constant film 25. The buffer film 26 is formed of, for example, silicon oxide.

The buffer film 26 is provided on the inner surface of the space 40; and the high dielectric constant film 25 is provided on the surface of the buffer film 26. In other words, the buffer film 26 is provided between the silicon pillar 16 and the high dielectric constant film 25, between the tunneling insulating film 21 and the high dielectric constant film 25, between the charge storage film 22 and the high dielectric constant film 25, between the blocking insulating film 23 and the high dielectric constant film 25, and between the electrode film 12 and the high dielectric constant film 25. The buffer film 26 contacts the high dielectric constant film 25 and contacts the silicon pillar 16.

According to the embodiment, the injection or the discharge of the electrons of the charge storage film 22 to or from above or below can be suppressed by providing, on the upper surface of the charge storage film 22 and on the lower surface of the charge storage film 22, the buffer film 26 that is made from silicon oxide and is a high barrier. As a result, the charge retention characteristics of the charge storage film 22 improve; and the data retention of the memory cell transistor improves. Also, misprogramming due to the operations of proximal memory cell transistors can be suppressed.

According to the embodiment, the buffer film 26 also is interposed between the electrode film 12 and the inter-cell portion 16a in addition to the high dielectric constant film 25; therefore, compared to the first embodiment, the volume of the air gap 13 interposed between the electrode film 12 and the inter-cell portion 16a is smaller by the amount of the thickness of the buffer film 26; and the capacitance C2 (referring to FIG. 1) increases. Thereby, the inversion layer can be formed more reliably in the inter-cell portion 16a.

When manufacturing the semiconductor memory device 2 according to the embodiment, the high dielectric constant film 25 can be formed stably by forming the buffer film 26 that is made of silicon oxide on the inner surface of the space 40 and by subsequently forming the high dielectric constant film 25 on the surface of the buffer film 26.

Otherwise, the configuration, the manufacturing method, the operations, and the effects of the embodiment are similar to those of the first embodiment described above.

Third Embodiment

A third embodiment will now be described.

Figure 4:
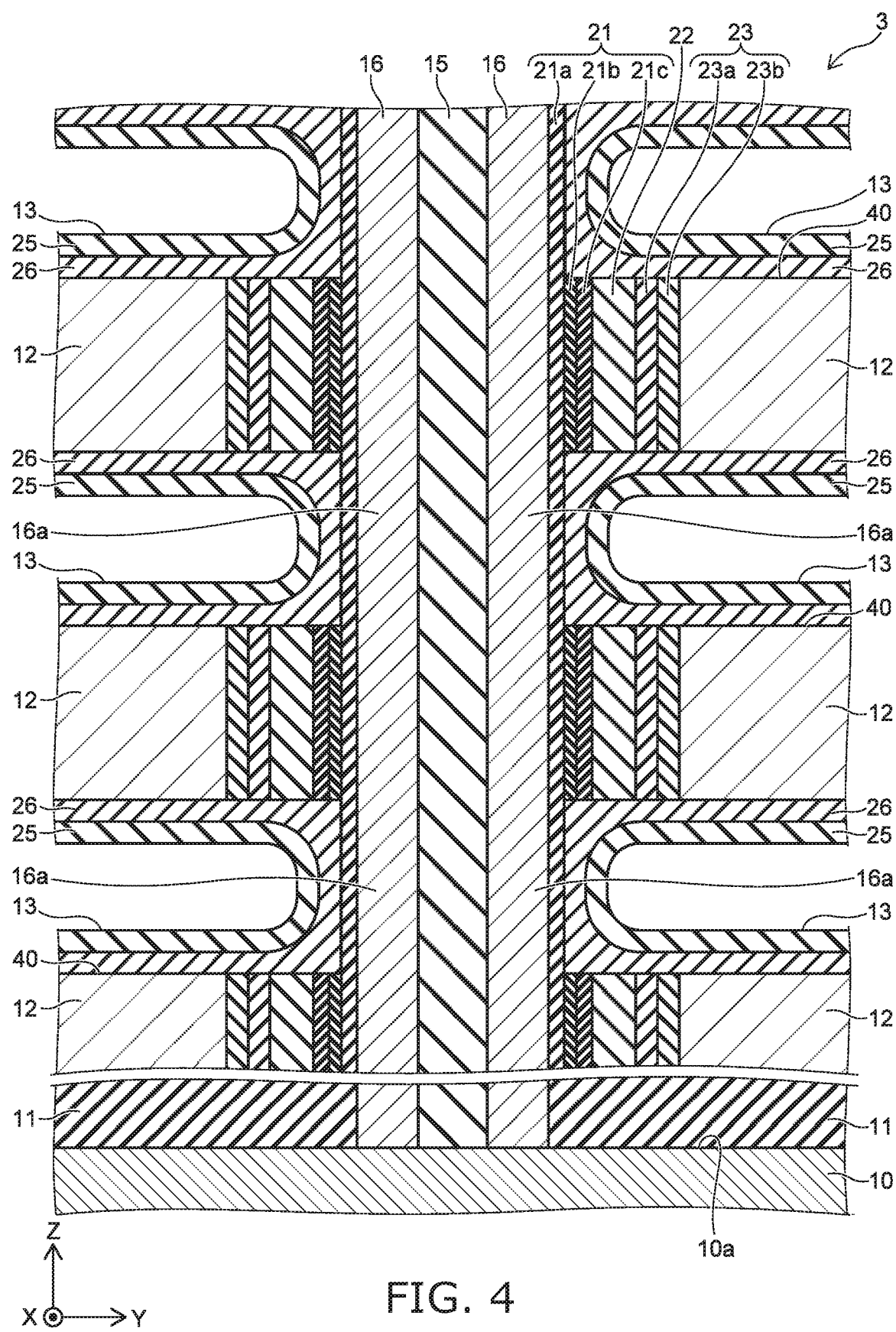
FIG. 4 is a cross-sectional view showing a semiconductor memory device according to a third embodiment.

FIG. 4 is a cross-sectional view showing a semiconductor memory device according to the embodiment.

As shown in FIG. 4, the semiconductor memory device 3 according to the embodiment differs from the semiconductor memory device 2 according to the second embodiment described above (referring to FIG. 3) in that the silicon oxide layer 21a of the tunneling insulating film 21 is disposed also between the silicon pillar 16 and the buffer film 26. The high dielectric constant film 25 is separated from the silicon pillar 16 with the silicon oxide layer 21a and the buffer film 26 interposed.

According to the embodiment, the silicon oxide layer 21a also is interposed between the electrode film 12 and the inter-cell portion 16a in addition to the high dielectric constant film 25 and the buffer film 26; therefore, compared to the second embodiment, the volume of the air gap 13 interposed between the electrode film 12 and the inter-cell portion 16a is smaller by the amount of the thickness of the silicon oxide layer 21a; and the capacitance C2 (referring to FIG. 1) increases. Thereby, the inversion layer can be formed more reliably in the inter-cell portion 16a.

When manufacturing the semiconductor memory device 3 according to the embodiment, damage of the silicon pillar 16 can be prevented by causing the silicon oxide layer 21a to remain in the process of removing the sacrificial films to form the spaces 40. Thereby, the characteristics of the memory cell transistor are stabilized.

Otherwise, the configuration, the manufacturing method, the operations, and the effects of the embodiment are similar to those of the second embodiment described above.

Fourth Embodiment

A fourth embodiment will now be described.

Figure 5:
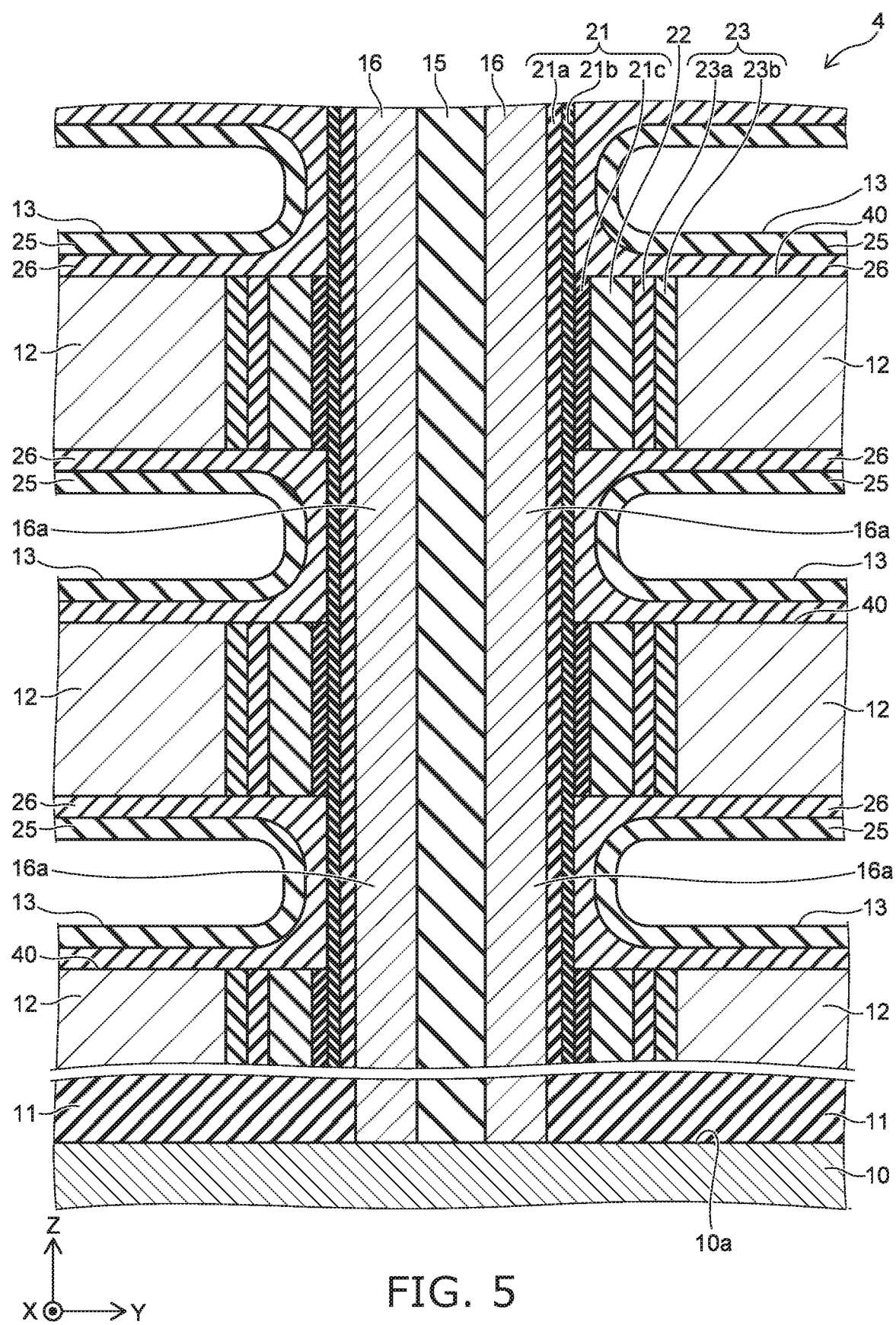
FIG. 5 is a cross-sectional view showing a semiconductor memory device according to a fourth embodiment.

FIG. 5 is a cross-sectional view showing a semiconductor memory device according to the embodiment.

As shown in FIG. 5, the semiconductor memory device 4 according to the embodiment differs from the semiconductor memory device 3 according to the third embodiment described above (referring to FIG. 4) in that the silicon oxide layer 21a and the silicon nitride layer 21b of the tunneling insulating film 21 are disposed also between the silicon pillar 16 and the buffer film 26. The high dielectric constant film 25 is separated from the silicon pillar 16 with the silicon oxide layer 21a, the silicon nitride layer 21b, and the buffer film 26 interposed.

According to the embodiment, the silicon nitride layer 21b also is interposed between the electrode film 12 and the inter-cell portion 16a in addition to the high dielectric constant film 25, the buffer film 26, and the silicon oxide layer 21a; therefore, compared to the third embodiment, the volume of the air gap 13 interposed between the electrode film 12 and the inter-cell portion 16a is smaller by the amount of the thickness of the silicon nitride layer 21b; and the capacitance C2 (referring to FIG. 1) increases. Thereby, the inversion layer can be formed more reliably in the inter-cell portion 16a.

According to the embodiment, for example, silicon oxide films can be used as the sacrificial films by using the silicon nitride layer 21b as an etching stopper when forming the spaces 40.

Otherwise, the configuration, the manufacturing method, the operations, and the effects of the embodiment are similar to those of the third embodiment described above.

Fifth Embodiment

A fifth embodiment will now be described.

Figure 6:
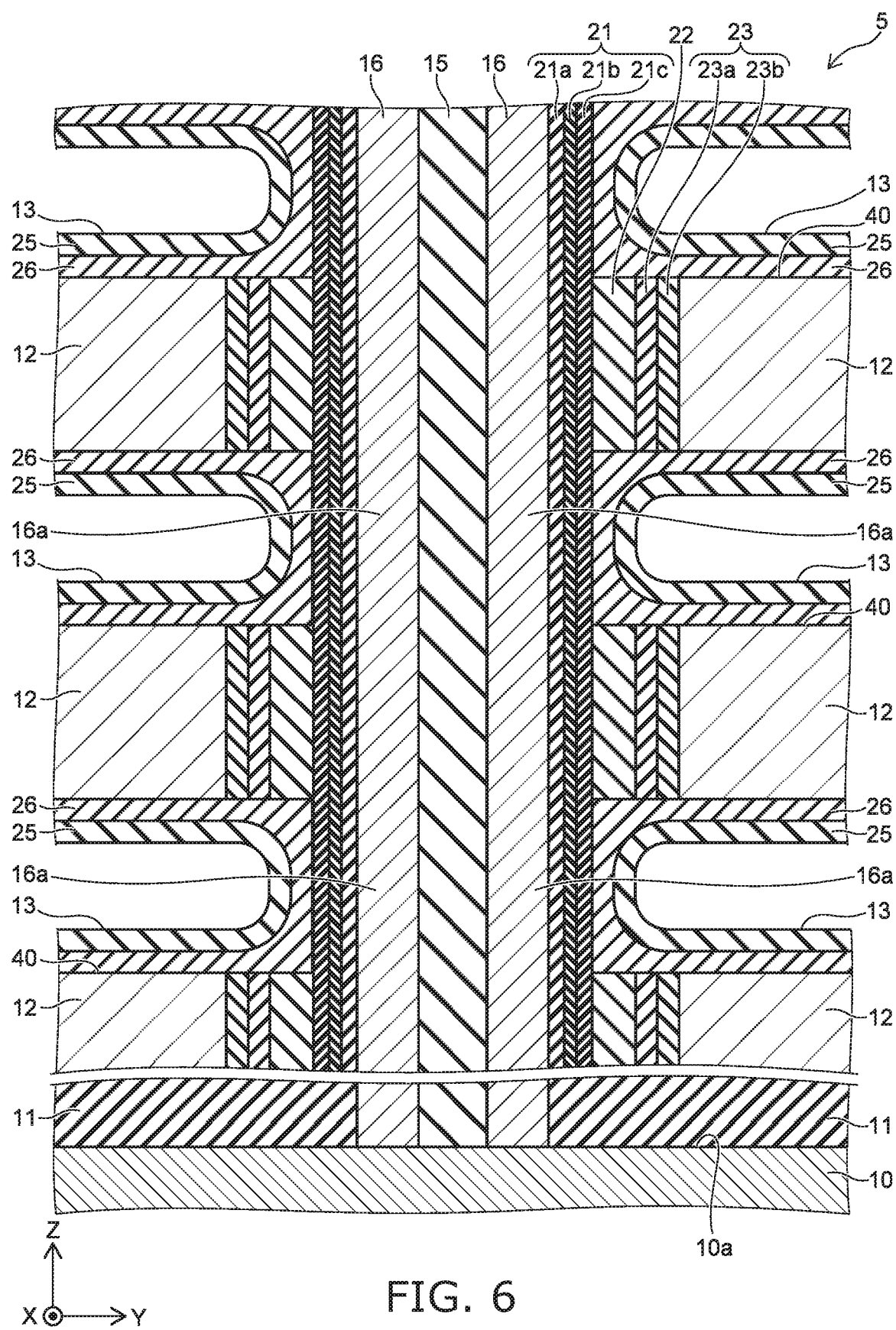
FIG. 6 is a cross-sectional view showing a semiconductor memory device according to a fifth embodiment.

FIG. 6 is a cross-sectional view showing a semiconductor memory device according to the embodiment.

As shown in FIG. 6, the semiconductor memory device 5 according to the embodiment differs from the semiconductor memory device 4 according to the fourth embodiment described above (referring to FIG. 5) in that the silicon oxide layer 21a, the silicon nitride layer 21b, and the silicon oxide layer 21c of the tunneling insulating film 21 are disposed also between the silicon pillar 16 and the buffer film 26. The high dielectric constant film 25 is separated from the silicon pillar 16 with the silicon oxide layer 21a, the silicon nitride layer 21b, the silicon oxide layer 21c, and the buffer film 26 interposed.

According to the embodiment, the high dielectric constant film 25, the buffer film 26, and the tunneling insulating film 21 are interposed between the electrode film 12 and the inter-cell portion 16a; therefore, compared to the fourth embodiment, the volume of the air gap 13 interposed between the electrode film 12 and the inter-cell portion 16a is smaller by the amount of the thickness of the silicon oxide layer 21c; and the capacitance C2 (referring to FIG. 1) increases. Thereby, the inversion layer can be formed more reliably in the inter-cell portion 16a.

Otherwise, the configuration, the manufacturing method, the operations, and the effects of the embodiment are similar to those of the fourth embodiment described above.

Sixth Embodiment

A sixth embodiment will now be described.

Figure 7:
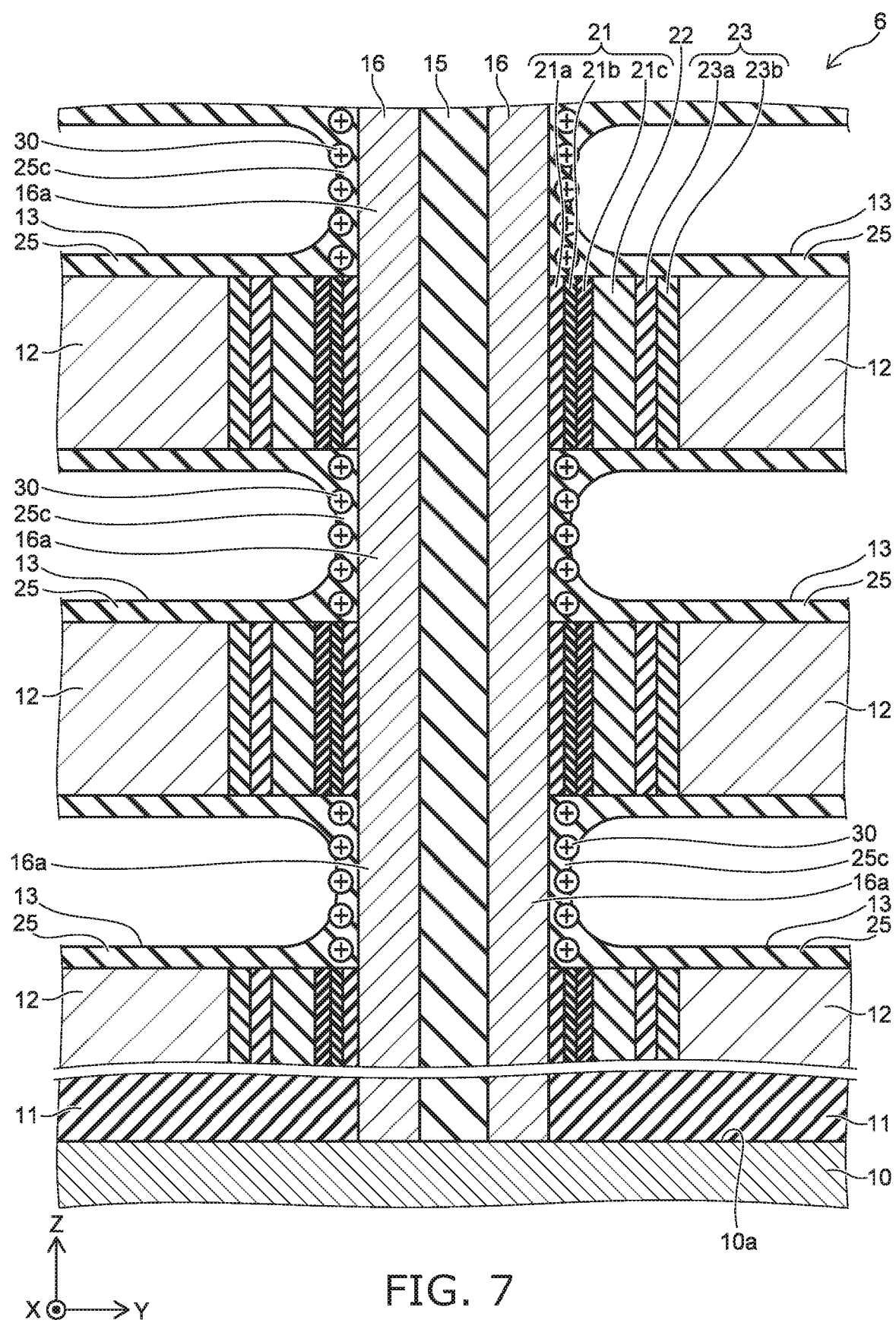
FIG. 7 is a cross-sectional view showing a semiconductor memory device according to a sixth embodiment.

FIG. 7 is a cross-sectional view showing a semiconductor memory device according to the embodiment.

As shown in FIG. 7, the semiconductor memory device 6 according to the embodiment has the configuration of the semiconductor memory device 1 according to the first embodiment described above (referring to FIG. 1 and FIGS. 2A and 2B) in which a positive fixed charge 30 is retained by the third portion 25c of the high dielectric constant film 25 disposed on the side surface of the silicon pillar 16. Thereby, the inversion layer is formed more easily in the inter-cell portion 16a of the silicon pillar 16.

Otherwise, the configuration, the manufacturing method, the operations, and the effects of the embodiment are similar to those of the first embodiment described above.

According to the embodiments described above, a semiconductor memory device can be realized in which the integration is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The embodiments described above may be implemented in combination with each other. For example, as in the third to fifth embodiments described above, a portion of the tunneling insulating film 21 may be interposed between the silicon pillar 16 and the high dielectric constant film 25 in the semiconductor memory device 1 according to the first embodiment described above. Further, in the case where the tunneling insulating film 21 is formed as a two-layer film, a portion of the tunneling insulating film 21 or the entire tunneling insulating film 21 may be interposed between the silicon pillar 16 and the high dielectric constant film 25 or between the silicon pillar 16 and the buffer film 26; for example, for a two-layer film including a silicon oxide layer and a silicon oxynitride layer as the tunneling insulating film 21, only the silicon oxide layer formed on the silicon pillar 16 side may be interposed between the silicon pillar 16 and the high dielectric constant film 25 or between the silicon pillar 16 and the buffer film 26. Also, as in the sixth embodiment, the positive fixed charge 30 may be retained in the third portion 25c of the high dielectric constant film 25 in the second to fifth embodiments.

What is claimed is:

1. A semiconductor memory device, comprising:
    a substrate;
    a plurality of electrode films arranged along a first direction with an air gap interposed, the first direction crossing a surface of the substrate;
    a semiconductor member extending in the first direction;
    a charge storage member provided between the semiconductor member and each of the electrode films; and
    a high dielectric constant film provided along an outer surface of the air gap, a relative dielectric constant of the high dielectric constant film being higher than a relative dielectric constant of silicon oxide,
    wherein the high dielectric constant film is formed to be continuous along a surface of a structure body, the structure body including two electrode films of the plurality of electrode films adjacent to each other in the first direction, the semiconductor member, and two charge storage members disposed respectively between the semiconductor member and the two electrode films.

2. The device according to claim 1, wherein in a cross section along the first direction, curvatures of high dielectric constant film surface portions exposed in the air gap at positions between a portion of the high dielectric constant film formed along a side surface of the semiconductor member and portions of the high dielectric constant film formed along surfaces of the two electrode films are smaller than curvatures of corner portions where the side surface of the semiconductor member crosses extension planes of the surfaces of the two electrode films.

3. The device according to claim 1, further comprising a first insulating film provided between the high dielectric constant film and the two electrode films, between the high dielectric constant film and the two charge storage members, and between the semiconductor member and the high dielectric constant film, an energy barrier of the first insulating film being higher than an energy barrier of the high dielectric constant film.

4. The device according to claim 3, wherein the first insulating film includes silicon oxide.

5. The device according to claim 1, wherein the high dielectric constant film contacts the semiconductor member.

6. The device according to claim 1, further comprising a second insulating film provided between the semiconductor member and the charge storage member, the high dielectric constant film being separated from the semiconductor member with at least a portion of the second insulating film interposed.

7. The device according to claim 1, wherein a positive charge is stored in a portion of the high dielectric constant film disposed between the semiconductor member and the air gap.

8. The device according to claim 1, wherein a p-n junction is not formed in a portion of the semiconductor member opposing the plurality of electrode films and the air gap.

9. The device according to claim 1, wherein the plurality of electrode films each surrounds the semiconductor member.

10. A semiconductor memory device, comprising:
    a substrate;
    a semiconductor member extending in a first direction and formed above the substrate, the first direction crossing a surface of the substrate;
    a first cell gate layer including a first control electrode and a first charge storage portion and being disposed to oppose a side surface of the semiconductor member, the first charge storage portion being provided between the first control electrode and the semiconductor member;
    a second cell gate layer including a second control electrode and a second charge storage portion and being disposed to oppose the side surface of the semiconductor member between the substrate and the first cell gate layer, the second charge storage portion being provided between the second control electrode and the semiconductor member; and
    an insulating film including a high dielectric constant film formed between the first cell gate layer and the second cell gate layer,
    the insulating film including a first portion, a second portion, and a third portion, the first portion being along a lower surface of the first cell gate layer, the second portion being along an upper surface of the second cell gate layer, the third portion being along the side surface of the semiconductor member, an air gap being disposed between the first portion and the second portion.

11. The device according to claim 10, wherein the first portion, the second portion, and the third portion are formed continuously.

12. The device according to claim 11, wherein in a cross section along the first direction, a curvature of an insulating film surface portion exposed in the air gap at a position between the second portion and the third portion is smaller than a curvature of a corner portion where the side surface of the semiconductor member crosses an extension plane of the upper surface of the second cell gate layer.

13. The device according to claim 11, wherein the insulating film further includes a first insulating film provided at least between the first charge storage portion and the high dielectric constant film, between the second charge storage portion and the high dielectric constant film, and between the semiconductor member and the high dielectric constant film, an energy barrier of the first insulating film being higher than an energy barrier of the high dielectric constant film.

14. The device according to claim 13, wherein
a relative dielectric constant of the high dielectric constant film is higher than a relative dielectric constant of silicon oxide, and
the first insulating film includes silicon oxide.

15. The device according to claim 10, wherein the insulating film contacts the side surface of the semiconductor member.

16. The device according to claim 10, wherein
the first and second cell gate layers both further include a second insulating film provided on the side surface of the semiconductor member, and
the insulating film is separated from the semiconductor member with at least a portion of the second insulating film interposed.

17. The device according to claim 10, wherein a positive charge is stored in the third portion of the insulating film.

18. The device according to claim 10, wherein a p-n junction is not formed in a portion of the semiconductor member opposing the first cell gate layer, the second cell gate layer, and the insulating film.

19. The device according to claim 10, wherein the first cell gate layer and the second cell gate layer each surround the semiconductor member.

20. A semiconductor memory device, comprising:
a substrate;
a plurality of electrode films arranged along a first direction with an air gap interposed, the first direction crossing a surface of the substrate;
a semiconductor member extending in the first direction;
a charge storage member provided between the semiconductor member and each of the electrode films; and
a high dielectric constant film provided along an outer surface of the air gap, a relative dielectric constant of the high dielectric constant film being higher than a relative dielectric constant of silicon oxide, and
wherein a p-n junction is not formed in a portion of the semiconductor member opposing the plurality of electrode films and the air gap.

* * * * *